United States Patent [19]
Allen

[11] Patent Number: 5,157,285
[45] Date of Patent: Oct. 20, 1992

[54] LOW NOISE, TEMPERATURE-COMPENSATED, AND PROCESS-COMPENSATED CURRENT AND VOLTAGE CONTROL CIRCUITS

[76] Inventor: Michael J. Allen, 3161 Pinchem Creek, Rescue, Calif. 95672

[21] Appl. No.: 752,772

[22] Filed: Aug. 30, 1991

[51] Int. Cl.⁵ ......................................... H03K 19/173
[52] U.S. Cl. .................................... 307/465; 307/443; 307/310; 307/296.8; 365/189.09
[58] Field of Search ............... 307/310, 443, 465, 491, 307/296.6, 296.8; 365/189.09, 210

[56] References Cited

U.S. PATENT DOCUMENTS

| | | | |
|---|---|---|---|
| 4,419,594 | 12/1983 | Gemmell et al. | 307/491 |
| 4,464,588 | 8/1984 | Wieser | 307/491 |
| 4,506,208 | 3/1985 | Nagano | 307/296.6 |

*Primary Examiner*—Edward P. Westin
*Assistant Examiner*—Benjamin D. Driscoll

[57] ABSTRACT

The present invention discloses techniques for reducing the low ambient temperature current consumption of circuits used along with sensing circuits in Programmable Logic Devices. Further, according to the present invention the supply voltage noise is substantially prevented from reaching the input of the sensing circuits of a Programmable Logic Device. In one embodiment, the present invention comprises a combination of a comparator, a reference voltage generator circuit, and a reference current and voltage generator circuit, which combination enables the present invention to substantially prevent the supply voltage noise from reaching the input of the sensing circuit of a Programmable Logic Device. Moreover, the present invention provides a technique for the reduction of the effect of semiconductor processing variations on the voltage of theh output signal of the present invention's temperature reference circuit. As such, the output of the temperature reference circuit of the present invention is a more accurate representation of the ambient temperature variations rather than semiconductor processing variations.

15 Claims, 2 Drawing Sheets

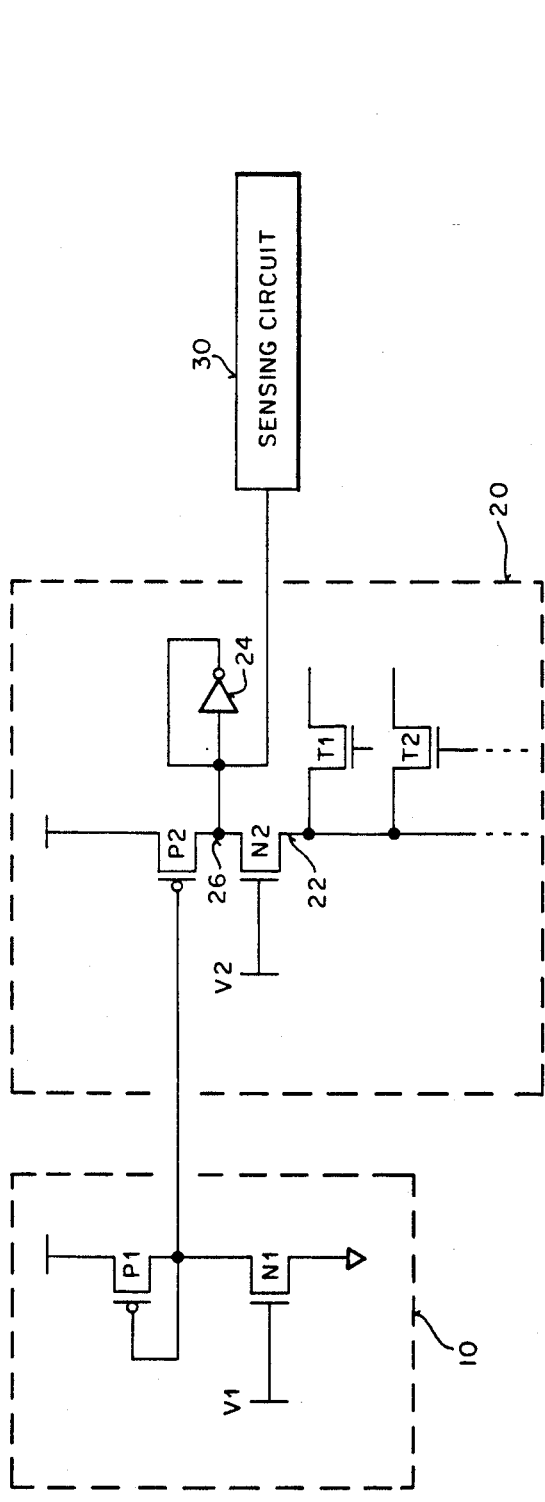
FIG._1 (PRIOR ART)
FIG._2

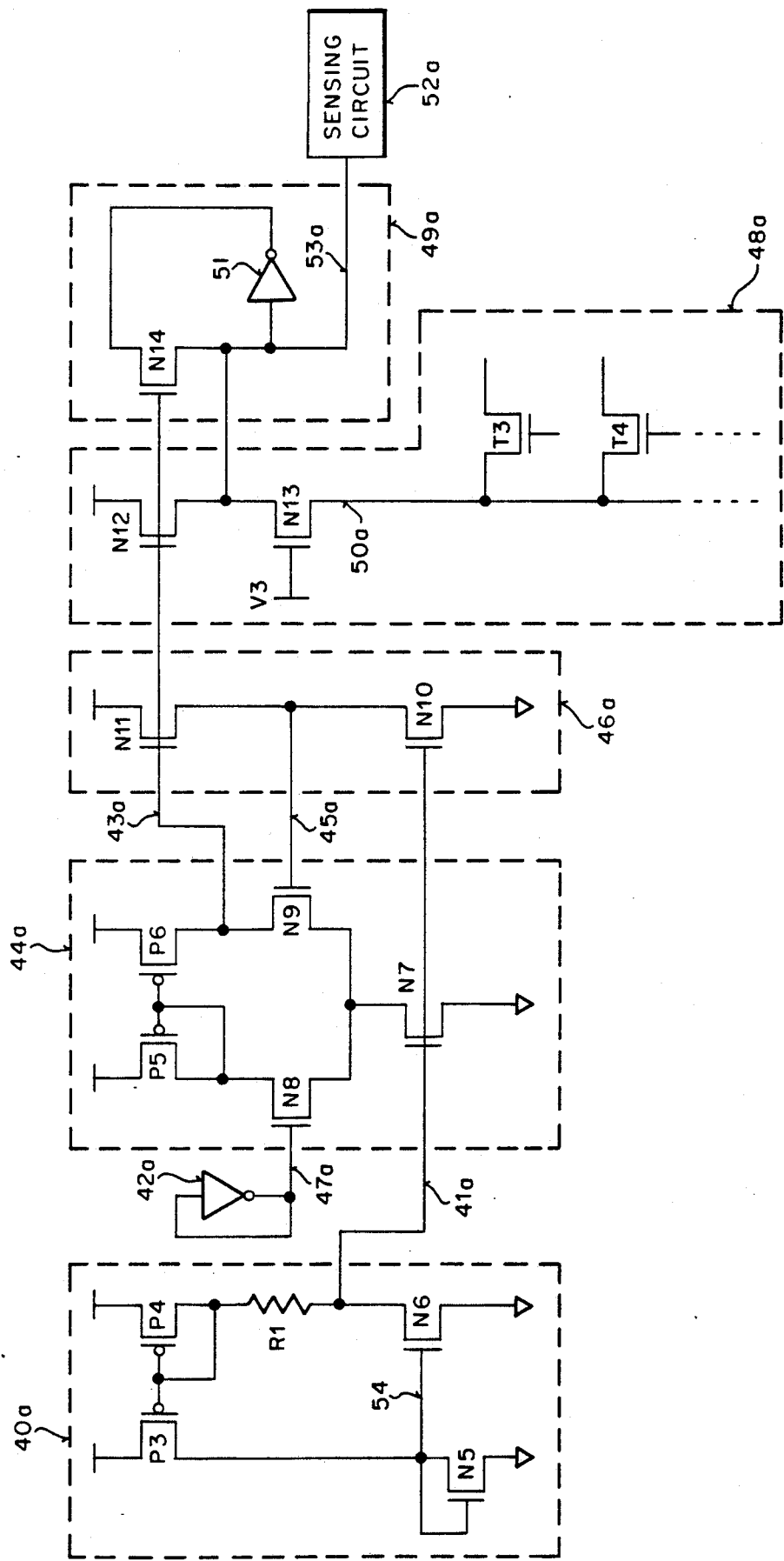

LOW NOISE, TEMPERATURE-COMPENSATED, AND PROCESS-COMPENSATED CURRENT AND VOLTAGE CONTROL CIRCUITS

BACKGROUND OF THE INVENTION

1. The present invention relates to the field of Programmable Logic Devices. More particularly, the present invention relates to low noise, temperature-compensated and process-compensated current and voltage control circuits in Programmable Logic Devices.

2. Description of the Prior Art

FIG. 1 depicts a typical circuit of a prior art Programmable Logic Device used to provide a current and bias voltage for a bit line connected to a sensing circuit. The circuit of FIG. 1 is comprised of a reference current and voltage generator circuit 10 and a bit line current and bias voltage control circuit 20.

The prior art reference current and voltage generator 10 is comprised of an N-channel transistor N1 and a P-channel transistor P1. The gate of the N-channel transistor N1 is connected to a signal V1. The drain of the N-channel transistor N1 is connected to the drain of transistor P1. The gate of transistor P1 is shorted to its drain as shown in FIG. 1.

Since the gate to source voltage of transistor N1 is determined by the voltage V1, the current flowing through transistor N1 is also determined by the voltage V1. This current also flows through transistor P1. Thus, the gate to source voltage of the transistor P1 is fixed by the current forced by transistor N1 to flow through transistor P1. Therefore, the reference current generated by transistor N1, in response to the voltage V1, generates a reference voltage at the gate of transistor P1. This reference voltage is therefore a representation of the reference current flowing through transistor N1.

The reference voltage generated by circuit 10 can be used to generate a current equal to the reference current of circuit 10 in the bit line current and bias voltage control circuit 20. The bit line current and bias voltage control circuit 20 is comprised of the P-channel transistor P2, N-channel transistor N2, bit line 22, transistor cells such as T1, and finally an invertor 24. Since transistor P2 has the same gate to source voltage as transistor P1, a current equal to the current flowing through transistor P1 of circuit 10 is generated by transistor P2 of circuit 20. As such, the current flowing through the bit line 22 is approximately equal to the reference current generated by circuit 10. Moreover, the bias voltage of the input at node 26, is determined by inverter 24 of the bit line current and bias voltage control circuit 20. This bias voltage connected to the input of the sensing circuit 30 is approximately equal to the trigger voltage of the invertor 24. Still referring to circuit 30 of FIG. 1, an N-channel transistor N2, which is driven by a signal V2, is used to establish a difference between the voltage at node 26, and the voltage of the bit line 22.

However, the prior art circuit of FIG. 1 used for providing a current for the bit line 22 and a bias voltage for a sensing circuit 30 has certain shortcomings. More particularly, the prior art circuit of FIG. 1 passes substantially all the supply voltage noise to node 26 through transistor P2. Furthermore, the current flowing from transistor P2 to the bit line 22 of circuit 20, like the current of a typical semiconductor circuit, increases in response to declining ambient temperature. However, since a semiconductor Programmable Logic Device typically has eighty current control and voltage bias circuits 20, the additional current for the cold ambient condition is typically about fifteen milliamperes. This current adds a large amount of power consumption to the total power consumption of a typical semiconductor Programmable Logic Device at the cold ambient condition. Also, according to the prior art reference current and voltage generating circuit 10, signal V1 driving transistor N1 typically has wide voltage swings in response to semiconductor processing variations of a semiconductor Programmable Logic Device. These wide voltage swings of signal V1 in turn cause large variations in the reference current generated by transistor N1.

Thus, one object of the present invention is to overcome the aforementioned shortcomings of the typical prior art current and bias voltage control circuit shown in FIG. 1. Therefore, it is an object of the present invention to reduce the supply voltage noise transmitted to the input of a sensing circuit such as the sensing circuit 30 of FIG. 1. Further, it is another object of the present invention to reduce the increased low-temperature current flow through a transistor cell bit line, such as the bit line 22 of FIG. 1. It is yet another object of the present invention to reduce process dependent voltage fluctuations of the input of a reference current and voltage generator such as the input signal V1 driving the gate of transistor N1 in circuit 10 of FIG. 1.

BRIEF SUMMARY OF THE INVENTION

The present invention discloses techniques for reducing the low ambient temperature current consumption of circuits used along with sensing circuits in Programmable Logic Devices. Further, according to the present invention the supply voltage noise is substantially prevented from reaching the input of the sensing circuits of a Programmable Logic Device. In one embodiment, the present invention comprises a combination of a comparator, a reference voltage generator circuit, and a reference current and voltage generator circuit, which combination enables the present invention to substantially prevent the supply voltage noise from reaching the input of the sensing circuit of a Programmable Logic Device. Moreover, the present invention provides a technique for the reduction of the effect of semiconductor processing variations on the voltage of the output signal of the present invention's temperature reference circuit. As such, the output of the temperature reference circuit of the present invention is an accurate representation of the ambient temperature variations rather than semiconductor processing variations.

BRIEF DESCRIPTION OF THE DRAWINGS

FIG. 1 shows a prior art circuit for generating a reference current, a reference voltage, and also for controlling a bit line current and bias voltage.

FIG. 2 is a block diagram of the circuit of the present invention.

FIG. 3 is a circuit schematic of the currently preferred embodiment of the present invention.

DETAILED DESCRIPTION OF THE INVENTION

FIG. 2 shows the circuit of the present invention in block diagram form. The Temperature Reference circuit 40 of FIG. 2 provides a temperature dependent bias voltage for the Reference Current and Voltage Generator circuit 46. More particularly, Temperature Reference circuit 40 reduces the voltage of the Temperature Reference circuit output signal 41 in response to declining ambient temperature. In response to the temperature dependent bias voltage provided by output signal 41 of Temperature Reference circuit 40 for Reference Current and Voltage Generator circuit 46, a temperature dependent current is forced to flow in Reference Current and Voltage Generator circuit 46. As such, as the ambient temperature decreases the current flowing in Reference Current and Voltage Generator circuit 46 also decreases.

Still referring to FIG. 2, the Comparator 44 compares two input signals as shown in FIG. 2. One of these two input signals is node 45 of Reference Current and Voltage Generator circuit 46. The other input signal is node 47 of invertor 42. Invertor 42 has its output shorted to its input so as to place the output voltage of the invertor, in other words the voltage at node 47, at the trigger voltage of invertor 42. As will be discussed fully below, inverter 42 is designed so that its trigger voltage matches the trigger voltage of the Sensing Circuit 52.

Referring again to Comparator 44 of FIG. 2, the two inputs to Comparator 44 discussed above (i.e. nodes 45 and 47) are compared such that the voltage of the output of Comparator 44 increases if the voltage provided by node 47 is higher than the voltage provided by node 45. Conversely, the voltage of the output of Comparator 44 decreases if the voltage provided by node 47 is less than the voltage provided by node 45. As such, when the voltage at node 47 provided by invertor 42 is greater than the voltage at node 45 provided by Reference Current and Voltage Generator circuit 46, the voltage of the output signal 43 of Comparator 44 is increased.

Still referring to FIG. 2, in accordance with the present invention an increase of the voltage of Comparator output signal 43 feeding Reference Current and voltage Generator circuit 46 forces Reference Current and Voltage Generator circuit 46 to increase the voltage at node 45. This increase in the voltage of node 45 continues to the point at which the voltage of node 47 and the voltage of node 45 are approximately equal. Conversely, when the voltage of node 47 provided by invertor 42 is less than the voltage of node 45 provided by Reference Current and Voltage Generator circuit 46, the voltage at node 45 is reduced by Reference Current and Voltage Generator circuit 46 to the point at which the voltage of node 47 and the voltage of node 45 are approximately equal.

As such, Comparator 44 performs the function of equalizing the voltage of node 47 provided by invertor 42, as the reference voltage, and the voltage of node 45 provided by Reference Current and Voltage Generator circuit 46. In performing this equalizing function, output signal 43 of Comparator 44 increases when the voltage at node 45 must be increased. Conversely, output signal 43 of Comparator 44 decreases when the voltage of node 45 must be decreased.

Furthermore, as discussed above, Temperature Reference circuit 40, through its output signal 41, causes a temperature dependent current to flow in Reference Current and Voltage Generator circuit 46. In that regard Comparator 44 forces the voltage of Comparator output signal 43 to be sufficiently high such that the difference in voltage between Comparator output signal 43 and node 45 allows the current demanded by output signal 41 to flow through Reference Current and Voltage Generator circuit 46. This aspect of the present invention regarding the difference in voltage between nodes 43 and 45 will be described fully in relation to the explanation of FIG. 3 of the present invention.

It is noted that the combination of Temperature Reference circuit 40, Comparator 44, and Reference Current and Voltage Generator circuit 46 is one aspect of the present invention. This aspect of the present invention accounts for the reduction of the supply voltage noise coupling in Bit Line Current Control circuit 48 as will be discussed fully later in this document.

Still referring to FIG. 2 of the present invention, the Bit Line Current Control circuit 48 receives output signal 43 of Comparator 44. Bit Line Current Control circuit 48 generates a current which is approximately equal to the reference current generated by the Reference Current and Voltage Generator circuit 46. This current generated by Bit Line Current Control circuit 48 is a current typically needed when the bit line 50 is being pulled low during the operation of the Programmable Logic Device.

Further, the Bit Line Bias Voltage Control circuit 49 places the voltage of the input 53 of Sensing Circuit 52 close to the reference voltage generated by inverter 42. As will be described in detail later in this document, the placing of the input voltage of Sensing Circuit 52 at the reference voltage generated by inverter 42 is necessary for the proper operation of Bit Line Current Control circuit 48.

Now referring to FIG. 3 of the present invention, the block diagrams of FIG. 2 are illustrated and explained in detail. For example, circuit 40A of FIG. 3 illustrates a detailed implementation of the Temperature Reference circuit 40 of FIG. 2. The voltage of output signal 41A of the Temperature Reference circuit 40A is used as a reference voltage which varies in response to variations of ambient temperature. In particular, the voltage of the output signal 41A decreases in response to declining ambient temperature. This is because as the ambient temperature declines, the resistivity of N-channel transistor N6 decreases at a faster rate than the resistivity of resistor R1 of Temperature Reference circuit 40A. As such, as the ambient temperature declines, the path from output signal 41A to ground becomes conductive at a faster rate than the path from output signal 41A to the supply voltage. Therefore, the voltage of output signal 41A of Temperature Reference circuit 40A decreases in response to declining ambient temperature.

Still referring to Temperature Reference circuit 40A of FIG. 3, the current flowing through transistor N6 and the resistor R1 fixes the gate to source voltage of P-channel transistor P4. This is because the gate voltage of transistor P4 would adjust itself to allow a current equal to the current flowing in transistor N6 and the resistor R1 to pass through the P-channel transistor P4.

Still referring to Temperature Reference circuit 40A, P-channel transistor P3 and N-channel transistor N5 provide a bias voltage for transistor N6. In that regard, one aspect of the present invention which provides for the reduction of the voltage fluctuation of reference voltage 41A in response to semiconductor processing variations is now discussed. As shown in FIG. 3, the voltage of signal 54 provides the gate drive for transistor N6. Since ideally the variations of reference voltage 41A of Temperature Reference circuit 40A should be only in response to variations of the ambient temperature, it is desirable to limit any unrelated interference by the voltage fluctuations of the gate voltage of transistor N6. As such, it is desirable to reduce the effect of semiconductor processing variations on the voltage of the signal 54 driving the gate of transistor N6. Thus, this reduction of the effect of semiconductor processing variations on the voltage of output signal 41A is achieved by reducing the effect of semiconductor processing variations on the gate voltage of transistor N6.

Further, it is noted that signal 54 feeding the gate of transistor N6, also represents the gate voltage of transistor N5. For this reason, it is desirable to keep the gate voltage of transistor N5 at a value which is always above the threshold voltage of transistor N6 so as to always keep transistor N6 on. Further, it is desirable to keep the difference in voltage between the gate voltage of transistor N5 and the threshold voltage of transistor N6 independent from semiconductor processing variations. This reduces the effect of semiconductor processing variations on the amount of current demanded by transistor N6.

To achieve a process-independent voltage difference between the voltage of the gate of transistor N5 and the threshold voltage of transistor N6, and further to achieve a gate voltage for transistor N5 which is greater than the threshold voltage of transistor N6, transistor N5 is chosen to be a normal-threshold transistor having a threshold of approximately 0.8 volts at typical semiconductor processing conditions. Furthermore, transistor N6 is preferably chosen to be a low-threshold transistor having a threshold of approximately 0.3 volts at typical semiconductor processing conditions. Since the two transistors N5 and N6 are laid out close to each other, the semiconductor processing variations will affect both transistors in an essentially similar manner. For example, if at one extreme of processing variations the threshold voltage of the normal-threshold transistor N5 is reduced to approximately 0.5 volts, the threshold voltage of the low-threshold transistor N6 is similarly reduced by 0.3 volts to approximately 0.0 volts. As such, according to this example, the difference between the threshold voltages of the two transistors N5 and N6 is preserved at an approximately constant value of 0.5 volts regardless of the semiconductor processing variations.

Therefore, by using this technique of keeping the gate bias voltage of transistor N6 less dependent on semiconductor processing variations, the voltage of Temperature Reference output signal 41A is also less sensitive to semiconductor processing variations. As such, the voltage of output signal 41A can be a more accurate representation of the ambient temperature variations rather than semiconductor processing variations.

Still referring to FIG. 3, the inverter 42A provides a reference voltage for the Comparator 44A. As illustrated in FIG. 3, the output of invertor 42A is shorted to the input of that invertor. This configuration places the output voltage and the input voltage of the inverter at approximately the trigger voltage of inverter 42A. For reasons which will be discussed later in this document, according to the present invention inverter 42A is designed so that its trigger voltage matches the trigger voltage of the Sensing Circuit 52A.

Still referring to FIG. 3, Comparator 44A essentially allows the present invention to use an N-channel transistor N11, instead of the prior art P-channel transistor, in a Reference Current and Voltage Generator circuit 46A. The use of an N-channel transistor N11 in the present invention's Reference Current and Voltage Generator circuit 46A, instead of a P-channel transistor, enables the present invention to prevent the supply voltage noise from reaching the input of Sensing Circuit 52A.

Still referring to FIG. 3, Comparator 44A has two input N-channel transistors N8 and N9. The input transistor N8 is driven by the reference voltage generated by inverter 42A discussed above. On the other hand, the input transistor N9 is driven by the Reference Current and Voltage Generator circuit 46A. Comparator 44A compares the voltage levels driving its input transistors N8 and N9 and adjusts the voltage at the Comparator output signal 43A according to the relative voltage values at the two input transistors N8 and N9. Thus, the voltage at the comparator output signal 43A increases if the voltage at the gate of transistor N8 is higher than the voltage at the gate of transistor N9. Conversely, the voltage of the comparator output signal 43A decreases if the voltage at the gate of transistor N8 is less than the voltage at the gate of transistor N9.

To illustrate the operation of Comparator 44A, an example is considered wherein the voltage of the gate of transistor N8 happens to be greater than the voltage of the gate of transistor N9. As discussed above, in that case the voltage of output signal 43A would begin to increase. As the voltage of output signal 43A continues to increase, transistor N11 becomes more conductive. Further, as transistor N11 becomes more conductive, the voltage of node 45A, or the voltage at the gate of transistor N9, begins to increase. This increase in the voltage of the gate of transistor N9 in turn slows down and eventually stops the increase in the voltage of Comparator output signal 43A. Thus, the voltage of Comparator output signal 43A increases to the degree that is necessary to equalize the voltages of the gates of the transistors N8 and N9, or the voltages at nodes 47A and 45A respectively. Conversely, if in the above example the voltage of the gate of transistor N8 were less than the voltage of the gate of transistor N9, the voltage of Comparator output signal 43A would decrease to the point necessary to bring the voltages at nodes 47A and 45A to equality.

Therefore, Comparator 44A performs the function of equalizing the voltage of node 45A with the reference voltage at node 47A provided by invertor 42A. Further, in performing this equalizing function, the voltage of Comparator output signal 43A is varied only in response to the variations in the voltage of node 45A. This is because the reference voltage at node 47A does not significantly vary in response to the ambient temperature variations, and as such it is only the variations of the voltage of node 45A that cause a difference in voltage between nodes 45A and 47A.

In addition to the requirement that the voltage of Comparator output signal 43A must be changed to bring the voltages at nodes 45A and 47A to equality, the voltage of Comparator output signal 43A must satisfy another requirement. This additional requirement is that the gate to source voltage of the transistor N11, or the difference between the voltage of node 43A and the voltage of node 45A, must be sufficient to accommodate the current demanded by transistor N10. Since the voltage at node 45A must be approximately equal to the value of the reference voltage of node 47A, the voltage at node 43A is varied by Comparator 44A to allow the current demanded by transistor N10 to flow through transistor N11. Therefore, the voltage of Comparator output 43A changes in such a manner that the difference between that voltage and the reference voltage at node 47A provided by inverter 42A is sufficient to allow the current demanded by Temperature Reference circuit output signal 41A to flow through transistor N11.

Finally, it is noted that the combination of Temperature Reference circuit 40A, Comparator 44A, and the N-channel transistor N11 is one aspect of the present invention. This aspect of the present invention accounts for preventing the supply voltage noise from reaching the bit line 50A of the Bit Line Current Control circuit 48A as discussed below.

Still referring to FIG. 3, now the operation of Bit Line Current Control circuit 48A is discussed. As illustrated in FIG. 3, N-channel transistor N12 of Bit Line Current Control circuit 48A is, like the N-channel transistor N11, driven by Comparator output signal 43A. Further, the N-channel transistors N12 and N11 are chosen to be of equal size. As such, if the gate to source voltages for both the transistors are approximately equal, currents of approximately equal value would flow in both transistors. Furthermore, the voltage at the source of transistor N12 is fixed by invertor 51 as approximately equal to the reference voltage of inverter 42A. Further, as discussed above, the voltage of node 45A, or the source of transistor N11, is equalized with the reference voltage of node 47A by Comparator 44A. Thus, both transistors N11 and N12 have approximately the same source voltages and further both transistors share the same gate voltage. As such, the gate to source voltage of transistor N12 is approximately equal to the gate to source voltage of transistor N11. Thus, the current of the N-channel transistor N11 is generated by transistor N12 of Bit Line Current Control circuit 48A This current also flows through transistor N13 to the bit line 50A. The current supplied by transistor N12 provides the current typically needed during times in which bit line 50A is being pulled low by the transistor cells such as T3 connected to bit line 50A. It is pointed out, as an example, that the transistor cells connected to bit line 50A may be electrically programmable read only memory cells or alternatively electrically erasable programmable read only memory cells.

Still referring to circuit 48A of FIG. 3, according to one aspect of the present invention the supply voltage noise is substantially prevented from reaching node 53A, or the input to Sensing Circuit 52A. This is accomplished by using the N-channel transistor N12 as a pull-up transistor connected to the supply voltage instead of connecting a P-channel transistor to the supply voltage as taught by the prior art. It is also noted that the utilization of Comparator 44A and inverter 42A and Current and voltage Generating circuit 46A as taught by the present invention obviates the need for a P-channel transistor in Bit Line Current Control circuit 48A, and instead allows the use of the N-channel transistor N12. The substantial prevention of the supply voltage noise from reaching input 53A of Sensing Circuit 52A occurs since the gate to source voltage of the N-channel transistor N12, unlike the prior art P-channel transistor, is not dependent on the supply voltage.

In that regard it is noted that a P-channel transistor typically has its source connected to the supply voltage. As such, the gate to source voltage of a P channel transistor fluctuates in response to the supply voltage noise. Thus, a Pchannel transistor, having its source connected to the supply voltage, would substantially transmit the supply voltage noise to the drain of the P-channel transistor. In contrast, an N-channel transistor, like transistor N12, does not have its source connected to the supply voltage. As such, the fluctuations in the supply voltage do not substantially change the gate to source voltage of the N-channel transistor N12. Thus, input 53A of Sensing Circuit 52A remains substantially free from the supply voltage noise. For example, according to the prior art, the supply voltage noise level at the input of Sensing Circuit 52A is greater than 200 millivolts. In contrast, the present invention reduces the supply voltage noise level at input 53A of Sensing Circuit 52A to less than 100 millivolts.

Still referring to Bit Line Current Control circuit 48A of FIG. 3 of the present invention, it is noted that according to one aspect of the present invention the current flowing in Bit Line Current Control circuit 48A is reduced at low temperatures. This is because Temperature Reference circuit 40A, as discussed hereinbefore, decreases the voltage of output signal 41A in response to declining ambient temperature. As further discussed hereinbefore, the voltage of signal 41A determines the current flowing through transistor N10, and further the current flowing through transistor N10 is also forced to flow through transistor N11. As further discussed above, this current is generated by transistor N12. Therefore, as the voltage of the output signal 41A decreases in response to declining ambient temperature, the current flowing through the N-channel transistor N12 also decreases.

It is noted that a typical Programmable Logic Device into which the circuit of the present invention can be employed may typically consist of eighty sensing circuits. In accordance with the temperature dependent current reduction aspect of the present invention described above, at low ambient temperature (about 0° C.) a current of approximately 180 microamperes is saved over each of the prior art sensing circuits. As such, the use of the low-temperature current reduction technique of the present invention typically results in a total current reduction of approximately 14.4 milliamperes.

Still referring to FIG. 3, the operation of Bit Line Bias Voltage Control circuit 49A is now discussed. Bit Line Bias Voltage Control circuit 49A is configured similar to inverter 42A. Thus, similar to inverter 42A, the input and output of the inverter 51 are coupled, by transistor N14, so that the voltage of signal 53A is approximately at the trigger voltage of inverter 51. It is recalled in the discussion of Bit Line Current Control circuit 48A that it is required that the voltage of node 53A be approximately equal to the reference voltage generated by inverter 42A. Thus, inverter 51 is sized such that the trigger voltage of inverter 51 is approximately equal to the trigger voltage of inverter 42A.

Still referring to Bit Line Bias voltage Control circuit 49A and also referring back to Bit Line Current Control circuit 48A, transistor N13 is driven by a signal V3. Transistor N13 essentially allows bit line 50A to assume a different voltage level than the voltage level of node 53A. In that regard it is desirable to keep the voltage level of bit line 50A between 1.20 volts and 1.05 volts to ensure long life for the data stored in the transistor cell array of a Programmable Logic Device. Since the typical voltage of node 53A is approximately 2.50 volts, transistor N13 ensures that there can be a difference in the voltage levels at input 53A of Sensing Circuit 52A, and the bit line 50A. As such, bit line 50A may assume a voltage between 1.20 and 1.05 volts, while the voltage of node 53A may remain at approximately 2.50 volts.

Finally, in the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative rather than a restrictive sense.

I claim:

1. A semiconductor logic device comprising:
   a first voltage generating means for providing a first reference voltage which decreases in response to a declining ambient temperature;
   a second voltage generating means for producing a second reference voltage which is substantially constant;
   a current and voltage generating means for generating a reference current and a third reference voltage, said current and voltage generating means decreasing said reference current in response to a decrease in said first reference voltage;
   comparator means for receiving said second and third reference voltages as inputs and for varying an output signal which adjusts said third reference voltage such that said comparator means functioning to equalize the voltage difference between said second and third reference voltages;
   bit line current control means coupled to a bit line for generating a bit line current in said bit line which is substantially equal to said reference current of said current and voltage generating means, said bit line current being responsive to said reference current such that said bit line current decreased in response to declining ambient temperature, wherein said bit line is coupled to one side of a plurality of transistor cells, and wherein said bit line current control means is driven by said output signal; and
   bit line bias voltage control means coupled to said bit line current control means, said bit line bias voltage control means being further coupled to a sensing circuit for providing an input bias voltage to said sensing circuit, said input bias voltage being substantially equal to said second reference voltage.

2. The semiconductor logic device of claim 1, wherein said first voltage generating means includes a low-threshold N-channel transistor driven by a normal-threshold N-channel transistor, said normal-threshold N-channel transistor providing a gate to source voltage for said low-threshold transistor substantially equal to the threshold voltage of said normal-threshold N-channel transistor.

3. The semiconductor logic device of claim 2, wherein said first voltage generating means includes a resistor coupled to said low-threshold transistor, wherein the resistivity of said resistor decreased by a first factor in response to declining ambient temperature, and wherein the resistivity of said low-threshold transistor decreases by a second factor in response to declining ambient temperature, and wherein said first factor is less than said second factor thereby causing said first reference voltage to decrease in response to declining ambient temperature.

4. The semiconductor logic device of claim 1, wherein said bit line voltage control means is comprised of an inverter with the output of said inverter being coupled to the input of said inverter, thereby causing said output of said inverter to remain at the trigger voltage of said inverter, and wherein said output of said inverter provides an input voltage to said sensing circuit, said input voltage being substantially equal to said second reference voltage.

5. The semiconductor logic device of claim 1, wherein said second voltage generating means comprises an invertor having an output coupled to the input of said inverter thereby causing said output of said inverter to remain at substantially the trigger voltage of said inverter, and wherein said output of said inverter supplied said second reference voltage.

6. The semiconductor logic device of claim 1 wherein said current and voltage generating means further includes a first N-channel transistor having its drain coupled to a supply voltage, its gate coupled to receive said output signal, and its source node providing said third reference voltage.

7. The semiconductor logic device of claim 6, wherein a first input of said comparator means is coupled to said second reference voltage, and wherein a second input of said comparator means is coupled to said source node of said first N-channel transistor.

8. The semiconductor logic device of claim 6, wherein said source node of said first N-channel transistor is further coupled to the drain of a second N-channel transistor, said second N-channel transistor having its gate coupled to receive said first reference voltage, wherein said second N-channel transistor causes said reference current of said current and voltage generating means to decrease in response to a decrease in said first reference voltage.

9. The semiconductor logic device of claim 1, wherein said bit line current control means further comprises a means for substantially preventing noise present on a supply voltage from reaching said input voltage of said sensing circuit.

10. The semiconductor logic device of claim 9, wherein said bit line current control means further includes an N-channel transistor, the drain of said N-channel transistor being coupled a supply voltage, and wherein the source to gate voltage of said N-channel transistor is substantially unchanged in response to noise present on said supply voltage, said N-channel transistor thereby substantially preventing noise present on the supply voltage from reaching said input voltage of said sensing circuit.

11. The semiconductor logic device of claim 1, wherein said plurality of transistor cells coupled to said bit line current control means comprise electrically programmable read only memory cells.

12. The semiconductor logic device of claim 1, wherein said plurality of said transistor cells coupled to said bit line current control means comprise electrically erasable and programmable read only memory cells.

13. A semiconductor logic device comprising:
   a first voltage generating means for providing a first reference voltage which varies in response to changes in ambient temperature;
   a current and voltage generating means for generating a reference current and a second reference voltage which varies in response to said first reference voltage; and
   bit line current control means coupled to a bit line for generating a bit line current in said bit line which is substantially equal to said reference current, said bitline current being driven by said second reference voltage and being responsive to said reference current such that said bit line current varies in response to variations in ambient temperature.

14. The semiconductor logic device of claim 13, wherein said bit line current control means further provides for substantially preventing noise present on the supply voltage from reaching said input voltage of said sensing circuit.

15. The semiconductor logic device of claim 13 further including a bit line bias voltage control means coupled to said bit line current control means, said bit line bias voltage control means being further coupled to a sensing circuit for providing an input voltage to said sensing circuit.

* * * * *

UNITED STATES PATENT AND TRADEMARK OFFICE
CERTIFICATE OF CORRECTION

PATENT NO. : 5,157,285
DATED : 10/20/92
INVENTOR(S) : Michael J. Allen

It is certified that error appears in the above-indentified patent and that said Letters Patent is hereby corrected as shown below:

Col. 1, line 49, delete "of"; and
      line 50, delete "the input".

Col. 7, line 31, delete "48A" and insert --48A.--; and
      line line 44, delete "53A." and insert --53A,--.

Col. 10, line 9, delete "supplied' and insert --supplies--; and
      line 64, delete "bitline" and insert --bit line --.

Signed and Sealed this

Seventeenth Day of May, 1994

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,157,285
DATED : October 20, 1992
INVENTOR(S) : Michael J. Allen

It is certified that error appears in the above-indentified patent and that said Letters Patent is hereby corrected as shown below:

| | | |
|---|---|---|
| Col. 1, Line 43 | Delete "invertor" | Insert --inverter-- |
| Col. 1, Line 54 | Delete "invertor" | Insert --inverter-- |
| Col. 3, Line 16 | Delete "invertor" | Insert --inverter-- |
| Col. 3, Line 16 | Delete "Invertor" | Insert --Inverter-- |
| Col. 3, Line 17 | Delete "invertor" | Insert --inverter-- |
| Col. 3, Line 19 | Delete "invertor" | Insert --inverter-- |
| Col. 3, Line 30 | Delete "invertor" | Insert --inverter- |
| Col. 3, Line 43 -44 | Delete "invertor" | Insert --inverter-- |
| Col. 3, Line 51 | Delete "invertor" | Insert --inverter-- |
| Col. 4, Line 52 | Delete "would-- | Insert --will-- |
| Col. 5, Line 53 | Delete "invertor" | Insert --inverter-- |
| Col. 5, Line 54 | Delete "invertor" | Insert --inverter-- |
| Col. 5, Line 61 | Delete "44A" | Insert --46A-- |

UNITED STATES PATENT AND TRADEMARK OFFICE
CERTIFICATE OF CORRECTION

PATENT NO. : 5,157,285
DATED : October 20, 1992
INVENTOR(S) : Michael J. Allen

It is certified that error appears in the above-indentified patent and that said Letters Patent is hereby corrected as shown below:

| | | |
|---|---|---|
| Col. 6, Line 43 | Delete "invertor" | Insert --inverter-- |
| Col. 7, Line 20 | Delete "invertor" | Insert --inverter-- |
| Col. 9, Line 24 | Delete "such that" | |
| Col. 10, Line 5 | Delete "invertor" | Insert --inverter-- |
| Col. 10, Line 10 | Delete "claim 1 wherein" | |
| | Insert --claim 1, wherein-- | |
| Col. 10, Line 38 | Delete "coupled a" | Insert --coupled to a-- |

Signed and Sealed this

Twenty-seventh Day of June, 1995

Attest:

BRUCE LEHMAN

Attesting Officer

Commissioner of Patents and Trademarks